United States Patent [19]
Hack et al.

[11] Patent Number: 5,083,175
[45] Date of Patent: Jan. 21, 1992

[54] METHOD OF USING OFFSET GATED GAP-CELL THIN FILM DEVICE AS A PHOTOSENSOR

[75] Inventors: Michael Hack, Mountain View; Malcolm J. Thompson; Hsing C. Tuan, Menlo Park, all of Calif.

[73] Assignee: Xerox Corporation, Stamford, Conn.

[21] Appl. No.: 586,462

[22] Filed: Sep. 21, 1990

[51] Int. Cl.⁵ ............................................. H01L 27/14
[52] U.S. Cl. ......................................... 357/30; 357/32; 357/2; 357/55
[58] Field of Search .................. 357/30 K, 30 H, 5 G, 357/5 I, 5 Q, 5 R, 32, 2, 58, 55, 59 C, 59 D, 23.7

[56] References Cited

U.S. PATENT DOCUMENTS

| | | | |
|---|---|---|---|
| 3,757,361 | 7/1988 | Brodsky et al. | 357/2 X |
| 4,752,814 | 6/1988 | Tuan | 357/2 X |
| 4,886,962 | 12/1989 | Gofuku et al. | 357/30 K X |
| 4,886,977 | 12/1989 | Gofuku et al. | 357/30 K X |

OTHER PUBLICATIONS

Kaweko et al., "Amorphous Silicon Phototransistors,", Appl. Phys. Lett. 56(7), 12 Feb. 1990, pp. 650–652.

*Primary Examiner*—William Mintel
*Attorney, Agent, or Firm*—Serge Abend

[57] ABSTRACT

A method of utilizing a thin film device as a photosensor. The thin film device comprises a substrate upon which is deposited a charge transport layer, first and second injecting electrodes in low electrical resistance contact with the charge transport layer, the injecting electrodes being laterally spaced from one another, a gate electrode spaced normally from the first and second injecting electrodes and located opposite the first injecting electrode, for controlling injection therefrom, and laterally offset from the second injecting electrode, and a gate dielectric layer separating the gate electrode from the first and second injecting electrodes and the charge transport layer. The method of utilization comprises applying a first electrical bias of a first magnitude to the first injecting electrode, applying a second electrical bias of a second magnitude to the second injecting electrode, inhibiting charge injection from the first injecting electrode by applying a third electrode bias to the gate electrode of a third magnitude, and illuminating the charge transport layer. The photosensor may be selectively operated in a unity gain mode or in a variable gain mode, wherein said unity gain mode is achieved by causing the second magnitude to be greater than the first magnitude and the variable gain mode is achieved by causing the second magnitude to be less than the first magnitude.

14 Claims, 2 Drawing Sheets

METHOD OF USING OFFSET GATED GAP-CELL THIN FILM DEVICE AS A PHOTOSENSOR

FIELD OF THE INVENTION

This invention relates to the use of an amorphous silicon offset gated gap-cell thin film device as a novel photosensor which is selectively operable in either a high photoconductive gain mode or a unity gain mode. In each mode of operation excellent dynamic range and low capacitance are exhibited. Additionally, operation of the device in the high gain mode generates high photocurrents and in the unity gain mode exhibits extremely low OFF state current leakage.

BACKGROUND OF THE INVENTION

Thin film semiconductor materials, and amorphous silicon in particular, have emerged over the past several years as prime candidates for use in low cost, large area thin film electronic applications. They have attractive electronic characteristics, are relatively simply fabricated by the plasma chemical vapor deposition (CVD) method, and are capable of large area (in excess of 12 inches by 12 inches) deposition upon inexpensive substrates, such as glass, at low processing temperatures. Initially amorphous silicon was used in photovoltaic applications and later in large area integrated circuits used in flat panel liquid crystal displays, solid state imagers, electronic copiers, printers and scanners. The relatively simple fabrication techniques enable the formation of active and passive electronic devices together with bus lines and interconnects on a single, page size (and larger) substrate. Such an array of thin film transistors may be used for driving active matrix liquid crystal displays as taught in a copending application U.S. Ser. No. 07/619,360, filed on Nov. 28, 1990 entitled "Timing Independent Pixel Scale Light Sensing Apparatus" (Hack et al.), assigned to the same assignee as the instant application. In a large area interactive display array, each pixel location would be provided with a control circuit including a phototransistor so as to be able to accept optical input for direct writing on the display with a light pen.

Amorphous silicon has been applied in solar cells and in photodiodes because of its high photoconductivity. In order to implement the optical input function, at the pixel level, in the above identified display, photosensors are incorporated into each control cell of the multi-cell array. Several factors enter into the selection of a satisfactory photosensor. It is important that the device has a large dynamic range (i.e. the ratio of photocurrent to dark current) so that it will be able to be switched ON and OFF reliably and rapidly. A large dynamic range will also allow many discernible levels of grey to be available, thereby enhancing the display output. Additionally, when a device exhibits high photoconductive gain it may be switched with lower levels of light which directly translates to lower cost lamps. Finally, low capacitance is often a desirable feature which is dictated by the circuit configuration in which it used.

It is well known that high photocurrent can be achieved by improving the charge injection efficiency into the photosensor by modifying the injecting contacts and by appropriately doping the semiconductor charge transport layer. However, both of these approaches cause the dark current to increase with the photocurrent, which could adversely affect the reliability of the OFF state of the device.

It is the primary object of the present invention to selectively utilize an offset gated, gap cell, thin film device as a photosensor in a high gain mode in which it will exhibit both low dark current and high photocurrent or in a unity gain mode in which it will exhibit an extremely high dynamic range and an extremely low dark current.

SUMMARY OF THE INVENTION

This object may be achieved, in one form, by providing an offset gate thin film device and utilizing it as a photosensor. The thin film device comprises a substrate upon which is deposited a charge transport layer, first and second injecting electrodes in low electrical resistance contact with the charge transport layer, the injecting electrodes being laterally spaced from one another, a gate electrode spaced normally from the first and second injecting electrodes and located opposite the first injecting electrode, for controlling injection therefrom, and laterally offset from the second injecting electrode, and a gate dielectric layer separating the gate electrode from the first and second injecting electrodes and the charge transport layer.

The method of utilization comprises applying a first electrical bias of a first magnitude to the first injecting electrode, applying a second electrical bias of a second magnitude to the second injecting electrode, inhibiting charge injection from the first injecting electrode by applying a third electrical bias to the gate electrode of a third magnitude, and illuminating the charge transport layer. The photosensor may be selectively operated in a unity gain mode or in a variable gain mode, wherein said unity gain mode is achieved by causing the second magnitude to be greater than the first magnitude and the variable gain mode is achieved by causing the second magnitude to be less than the first magnitude.

BRIEF DESCRIPTION OF THE DRAWINGS

A more complete understanding of the present invention and its attendant advantages may be obtained by reference to the following drawings taken in conjunction with the accompanying description in which.

DETAILED DESCRIPTION OF THE PREFERRED EMBODIMENTS

Figure 1:
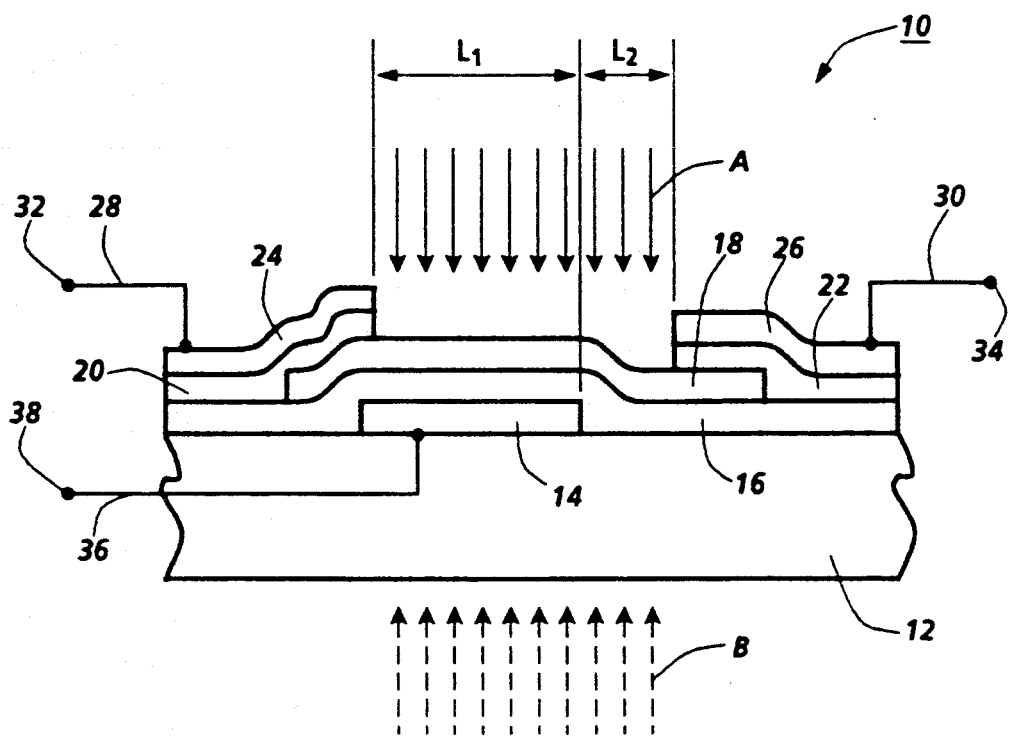
FIG. 1 is a schematic cross-sectional view of one form of an offset gated gap-cell thin film photosensor.
Figure 2:
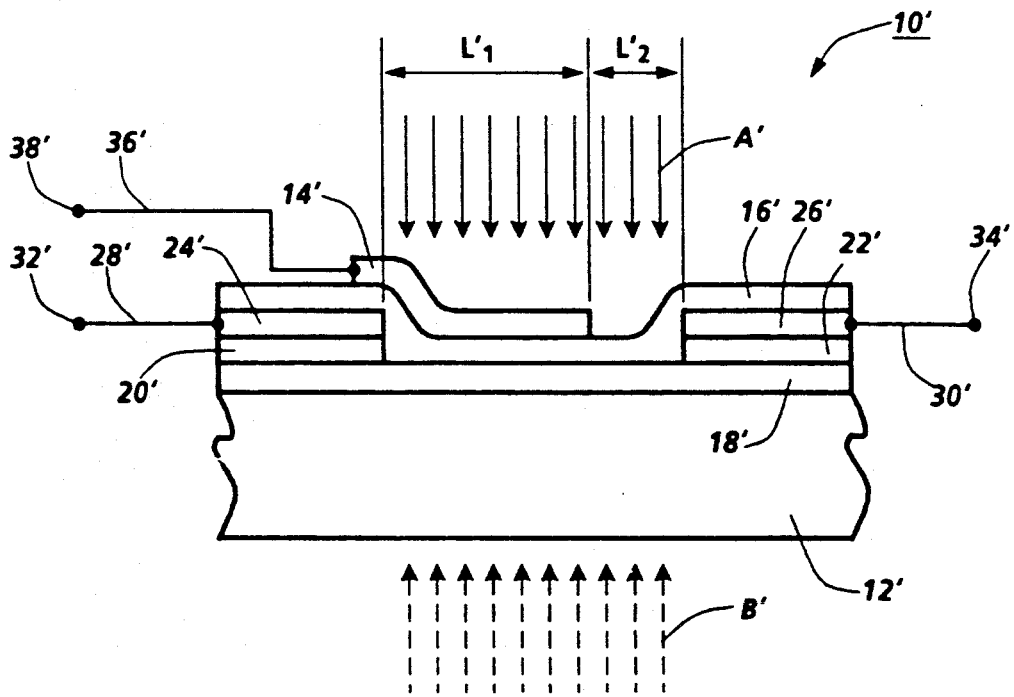
FIG. 2 is a schematic cross-sectional view of another form of an offset gated gap-cell thin film photosensor.

Turning to the drawings, there is illustrated in FIGS. 1 and 2 two alternative configurations of an offset gated gap-cell thin film device used as a photosensor. The device has virtually the same construction as that of the high voltage thin film transistor shown and described in U.S. Pat. No. 4,752,814 (Tuan) entitled "High Voltage Thin Film Transistor" and in U.S. Pat. No. 4,998,146 (Hack) entitled "High Voltage Thin Film Transistor". This offset gated, gap cell device is known to enable the switching of up to several hundred volts under the control of a low voltage (on the order of 10 volts) gate signal. The key to operation of this opposite the source electrode and is laterally spaced from the drain electrode. This construction results in the selective formation of a gate controlled accumulation channel of the charge transport layer (channel region) and an uncontrolled portion of the charge transport layer (dead region). Current flow through the dead region will be spaced charge limited (SCLC).

In FIG. 1 the photosensor 10 comprises a substrate 12, which may be of glass, ceramic, or other suitable material, upon which is deposited a gate electrode 14 made of a conductive material, such as chromium (about 1000Å thick), a gate dielectric layer 16 made of silicon nitride (about 3000Å thick), and a charge transport layer 18 made of substantially undoped amorphous silicon (about 500 to 1000Å thick). Injecting electrodes 20 and 22 (each about 500 to 1000Å thick) thick are laterally spaced from one another and are in intimate contact with charge transport layer 18. These electrodes are made of amorphous silicon suitably doped to be conducting and to provide charge carriers of the desired type, i.e. electrons (doped n) or holes (doped p). For the purposes of the present description it will be understood that the injecting electrodes are doped n-type. Metal contacts 24 and 26, each made of aluminium or chromium (about 2000Å thick) overlie the injecting electrodes. It will become apparent, when the various operating bias conditions are discussed, that either one of the injecting electrodes will be able to inject electrons and the other will receive electrons. Therefore, for sensor applications we choose not to use the terminology source and drain electrodes herein because those descriptors carry with them an implication of injection of electrons from the source and reception thereof by the drain. Rather we refer to an injecting electrode located opposite to the gate and an injecting electrode offset from the gate.

In the FIG. 2 embodiment of the photosensor 10', similar elements are identified by similar numerals with a prime (') added. The charge transport layer 18' is deposited directly upon the substrate 12° and the injecting electrodes and their contacts are patterned thereover. A gate dielectric layer 16' overlies the injecting terminals and a gate electrode 14' is deposited thereupon so that is overlaps the injecting electrode 20' and is laterally offset from the injecting electrode 22'.

In FIG. 1, schematically represented conductive traces 28 and 30 are deposited so as to electrically connect contacts 24 and 26 with terminals 32 and 34 which, in turn, may be connected with suitable potential sources (as will be discussed). Similarly, a conductive trace 36 is connected between gate electrode 14 and terminal 38. In a mode of operation in which terminals 32 and 38 are connected to the same potential source, the device appears to be a two terminal device. Similarly, in FIG. 2, schematic representations of connections are shown with primes attached.

Figure 3:
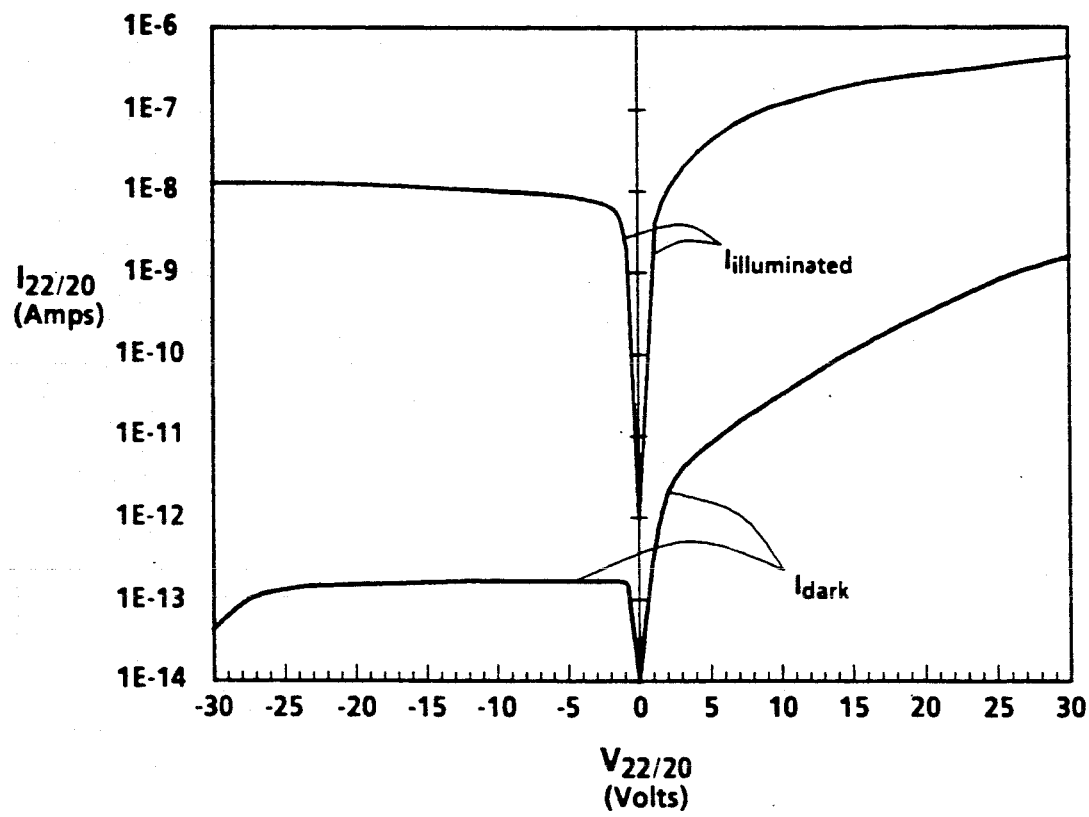
FIG. 3 is a graphical representation of the output characteristics of the photosensor of this invention.

Because fifty or more volts may be required to switch some liquid crystal materials this high voltage structure with the offset gate electrode is particularly attractive for use with them. However, it should be noted that this device also may be used satisfactorily for switching low voltages. The offset dimension $L_2$ will be selected in accordance with the normal operating potential difference between injecting electrodes 20 and 22. Low voltage operation will be satisfactorily accomplished with an $L_2$ of 10 μm. The characteristic curves of FIG. 3 represent a device wherein the gated channel region $L_1$ and the ungated dead region $L_2$ were each 10 μm. Higher voltage operation has also been accomplished with devices in which $L_1=L_2=30$ μm and 50 μm. An additional advantage of the offset structure is the low device capacitance which could be of concern in certain circuit arrangements such as that described in the copending application which is now U.S. Ser. No. 07/619,360.

When the photoconductive charge transport layer 18 is illuminated, each photon impinging thereon will produce one electron and one hole. Under continued illumination the electron will flow to the more positive injecting electrode and the hole will flow to the more negative injecting electrode. If charge injection from the injecting electrode is not blocked, and the charge carriers are free to be injected, they will effectively attempt to transverse the device channel and the external circuit a number of times. The ratio of their lifetime to the transit time between the injecting electrodes 20 and 22 determines the photoconductive gain ($\eta$) multiple. When the injecting electrode is blocked, only unity gain is possible. Because there is no gate electrode controlling injection from the offset injecting electrode 22, charge injection therefrom will not be blocked. Charge injection may be blocked from the injecting electrode 20 if the potential difference between the gate electrode 14 and the opposite injecting electrode 20 is less than the threshold voltage ($V_{TH}$) of the device (e.g. about 1 volt for the tested device), and enhanced if the potential difference is greater than $V_{TH}$. Since the charge transport layer 18 becomes conductive where illuminated, it is desirable to illuminate it over substantially the entire distance form one injecting electrode to the other, in order to excite the entire channel between injecting electrodes. It is sufficient if the illuminated region is within a carrier drift length of each injecting electrode (i.e. about 2 or 3 μm for electrons in amorphous silicon; less for holes) in order for carriers to move freely between the injecting electrodes.

Topside illumination, indicated by arrows A, in the device configuration of FIG. 1 fully spans the interelectrode distance. Bottomside illumination of the device according to FIG. 1, as indicated by arrows B, must be transmitted through the substrate 12 and the gate electrode 14 both of which would have to be made of optically transparent material. The substrate could be made of glass or quartz and the gate electrode could be made of indium tin-oxide (ITO), tin oxide or other suitable material. Topside illumination A' in a device of the FIG. 2 configuration requires an optically transparent gate electrode, and bottomside illumination B' requires the judicious selection of an optically transparent material for the substrate.

The curves illustrated in FIG. 3 represent the output characteristics of a device in which the gated channel region $L_1$ and the ungated dead region $L_2$ were each 10 μm long and the channel width (i.e. the dimension normal to the plane of the drawing) was 50 μm, The photosensor was operated as a two terminal device with the injecting electrode 20 connected to the gate electrode 14 and a varying potential V (volts) was applied to both, while the injecting electrode 22 was connected to ground. We took measurements in the dark and under an illumination of $10^{14}$ photons/cm$^2$/sec. The illumination current ($I_{ill}$) and dark current ($I_d$) were plotted over a range of interelectrode bias values from $-30$ volts to $+30$ volts.

Since the injecting electrode 20 and the gate electrode were tied together and their potential difference was 0 volts, i.e. below the $V_{TH}$ of about 1 volt, charge injection from injecting electrode 20 was blocked. Of course, there was no blockage from injecting electrode 22. Thus, when the injecting electrode 20 was positive with respect to the injecting electrode 22 (0 volts to +30 volts), electrons were injected from injecting electrode 22 and, when illuminated, there was evidenced a potential dependent photoconductive gain. In the dark, current was limited by the dead region $L_2$, giving rise to a useful dynamic range (light to dark current ratio) of about three decades (1000×). Conversely, when the injecting electrode 20 was negative with respect to the injecting electrode 22 (0 volts to −30 volts), electrons were prevented from being injected from the injecting electrode 20. The unity gain obtained under illumination is evidenced by the flat response. In the dark, no charge carriers flow, resulting in a far superior dynamic range of about five decades (100,000×) and an exceptionally low dark current of about 0.1 picoamp at −30 volts. A comparison of the variable gain with the unity gain allows us to determine the multiple of gain (i.e. about 10× at +10 volts to about 50× at +30 volts).

As can be seen, the variable gain mode has the advantage of high photocurrent, thereby enabling lower cost illumination sources and the unity gain mode has the advantage of high dynamic range and extremely low dark current, enabling higher speed and grey scale operation. It is possible, by changing the bias applied to the three electrodes 20, 22 and 14, to selectively enable a desired mode of operation.

When the potential difference between gate electrode 14 and its opposite injecting electrode 20 is less than the threshold voltage of the device ($V_{14/20} < V_{TH}$), the gate electrode will block electron injection from electrode 20 and no accumulation channel will be formed. Upon illumination of the device, and when $V_{22} > V_{20}$, the photogenerated electrons flow to electrode 22 and the device operates in the unity gain mode. Upon illumination of the device, and when $V_{20} > V_{22}$, photogenerated electons flow to electrode 20 and can reenter from electrode 22 since there is no blockage of injection of electrons from that electrode. This condition gives rise the the variable gain mode.

A higher gain mode will always occur when the potential difference between gate electrode 14 and its opposite injecting electrode 20 is greater than the threshold voltage of the device ($V_{14/20} > V_{TH}$). This occurs because there would be no inhibition to charge injection from either injecting electrode allowing the charge carrier lifetimes to exceed their transit times. In the dark there will be a small leakage current flowing across the dead region $L_2$ under the influence of the bias between the injecting electrodes, giving rise to the increasing dark current.

It can not be appreciated that in order to operate this device satisfactorily in the unity gain mode, wherein no charge injection will occur from electrode 20, substantially the entire channel length from injecting electrode 20 to injecting electrode 22 must be illuminated. Therefore, any layer intermediate the source of illumination and the charge transport layer 18, within the channel region, (i.e. the substrate or the gate electrode) must be optically transparent.

It should be understood that the present disclosure has been made only by way of example and that numerous other changes in details of construction and the combination and arrangement of elements may be resorted to without departing from the true spirit and scope of the invention as hereinafter claimed.

What is claimed:

1. A method of utilizing a thin film device as a photosensor comprising the steps of
   providing a substrate upon which is deposited a charge transport layer, first and second injecting electrodes in electrical contact with said charge transport layer and being laterally spaced from one another, a gate electrode spaced normally from said first and second injecting electrodes and located opposite said first injecting electrode and laterally offset from said second injecting electrode, and a gate dielectric layer separating said gate electrode from said first and second injecting electrodes and said charge transport layer, and being characterized by
   applying a first electrical bias of a first magnitude to said first injecting electrode,
   applying a second electrical bias of a second magnitude to said second injecting electrode,
   inhibiting charge injection from said first injecting electrode by applying a third electrical bias to said gate electrode of a third magnitude,
   illuminating said charge transport layer, and
   selectively operating said photosensor in one of two modes of operation, said modes being a unity gain mode and a variable gain mode,
   wherein said unity gain mode is achieved by causing said second magnitude to be greater than said first magnitude and said variable gain mode is achieved by causing said second magnitude to be less than said first magnitude.

2. The method as defined in claim 1 wherein said step of inhibiting charge injection comprises causing said third magnitude to be less than or equal to said first magnitude.

3. The method as defined in claim 1 wherein said step of inhibiting charge injection comprises causing the difference between said third magnitude and said first magnitude to be less than a threshold voltage of said device.

4. The method as defined in claim 1 wherein said step of illuminating takes place over substantially the full lateral distance between said first injecting electrode and said second injecting electrode.

5. The method as defined in claim 4 wherein said step of illuminating takes place through said substrate.

6. The thin film photosensor as defined in claim 4 wherein said step of illuminating takes place through said gate electrode.

7. The thin film photosensor as defined in claim 4 wherein said step of illuminating takes place through said substrate and said gate electrode.

8. The method as defined in claim 1 wherein operating said photosensor in said unity gain mode results in a dynamic range greater than $10^3$ and a gain of greater than 10.

9. A thin film photosensor as defined in claim 1 wherein operating said photosensor in said unity gain mode results in a dynamic range greater than $10^5$ and a dark current of about $10^{-13}$ amps.

10. A method of utilizing a thin film device as a photosensor comprising the steps of
    providing a substrate upon which is deposited a charge transport layer, first and second injecting electrodes in electrical contact with said charge transport layer and being laterally spaced from one another, a gate electrode spaced normally from said first and second injecting electrodes and located opposite said first injecting electrode and laterally offset from said second injecting electrode, and a gate dielectric layer separating said gate electrode from said first and second injecting electrodes and said charge transport layer, and being characterized by applying a first electrical bias of a first magnitude to said first injecting electrode, applying a second electrical bias of a second magnitude to said second injecting electrode, enhancing charge injection from said first injecting electrode by applying a third electrical bias to said gate electrode of a third magnitude, illuminating said charge transport layer, and operating said photosensor in a high gain mode regardless of the difference between said first and second magnitudes.

11. The method as defined in claim 10 wherein said step of illuminating takes place over substantially the full lateral distance between said first injecting electrode and said second injecting electrode.

12. The method as defined in claim 10 wherein said step of illuminating takes place through said substrate.

13. The thin film photosensor as defined in claim 10 wherein said step of illuminating takes place through said gate electrode.

14. The thin film photosensor as defined in claim 10 wherein said step of illuminating takes place through said substrate and said gate electrode.

* * * * *